United States Patent [19]
Harwell

[11] Patent Number: 6,142,590
[45] Date of Patent: Nov. 7, 2000

[54] TWO U VERTICAL HEIGHT KEYBOARD AND FLATSCREEN DRAWER FOR A SERVER SYSTEM RACK

[75] Inventor: William H. Harwell, Arlington, Tex.

[73] Assignee: Central Industrial Supply Company, Grand Prairie, Tex.

[21] Appl. No.: 09/286,192

[22] Filed: Apr. 5, 1999

[51] Int. Cl.[7] .................................................. H05K 7/18
[52] U.S. Cl. ................................. 312/223.1; 312/223.6; 312/208.1; 312/334.8
[58] Field of Search ................................... 361/725, 727; 312/208.1, 223.2, 223.1, 223.3, 334.5, 334.4, 291, 223.6, 334.8, 7.2, 334.2; 211/26, 151; 248/51, 52, 917, 918; 403/61

[56] References Cited

U.S. PATENT DOCUMENTS

| | | | |
|---|---|---|---|
| 3,133,768 | 5/1964 | Klakovich | 312/334.8 X |
| 3,606,112 | 9/1971 | Cheshier | 312/334.8 X |
| 4,614,383 | 9/1986 | Polley et al. | 312/223.1 |
| 5,161,028 | 11/1992 | Kawata et al. | 312/7.2 X |
| 5,213,401 | 5/1993 | Hatcher | 312/208.1 |
| 5,388,032 | 2/1995 | Gill et al. | 361/727 X |
| 5,443,312 | 8/1995 | Schluter | 312/223.1 X |
| 5,460,441 | 10/1995 | Hastings et al. | 312/334.8 X |
| 5,568,775 | 10/1996 | Rizzi et al. | 403/61 X |
| 5,833,337 | 11/1998 | Kofstad | 312/334.5 |
| 5,946,055 | 8/1999 | Rosen | 312/7.2 X |

Primary Examiner—Janet M. Wilkens
Attorney, Agent, or Firm—Stephen S. Mosher; Gregory M. Howison; Mark W. Handley

[57] ABSTRACT

A shelf having self-adjusting mounting rails and a drawer which is slidably mounted to the shelf are provided for a server system rack. The mounting rails of the shelf are telescopically adjustable to vary the lengths of the mounting rails for accommodating racks having varying horizontal depths. Opposite ends of the mounting rails are rigidly fastened to the rack to fix the lengths of the mounting rails to fit the horizontal depth of the rack. The shelf further includes an enclosure which is fastened to the mounting rails. Telescoping, bearing slide assemblies are mounted to respective ones of opposite, interior sides of the enclosure and to opposite exterior sides of the drawer to slidably secure the drawer to the shelf for moving between an inward position, disposed substantially within the shelf, and an outward position, extending exteriorly of the shelf. A flexible cable arm is secured to the rear of the drawer and the rear of the shelf for securing cables which pass between the drawer and the enclosure. A keyboard and a flatscreen monitor are preferably mounted within the drawer. The flatscreen monitor is pivotally mounted to the drawer, such that when the drawer is disposed in the outward position, the monitor may be angularly moved between an upward, viewing position for viewing the monitor and a downward position, stowed within the drawer for sliding underneath the shelf. A monitor clutch is provided for supporting the monitor in the upward, viewing position.

18 Claims, 7 Drawing Sheets

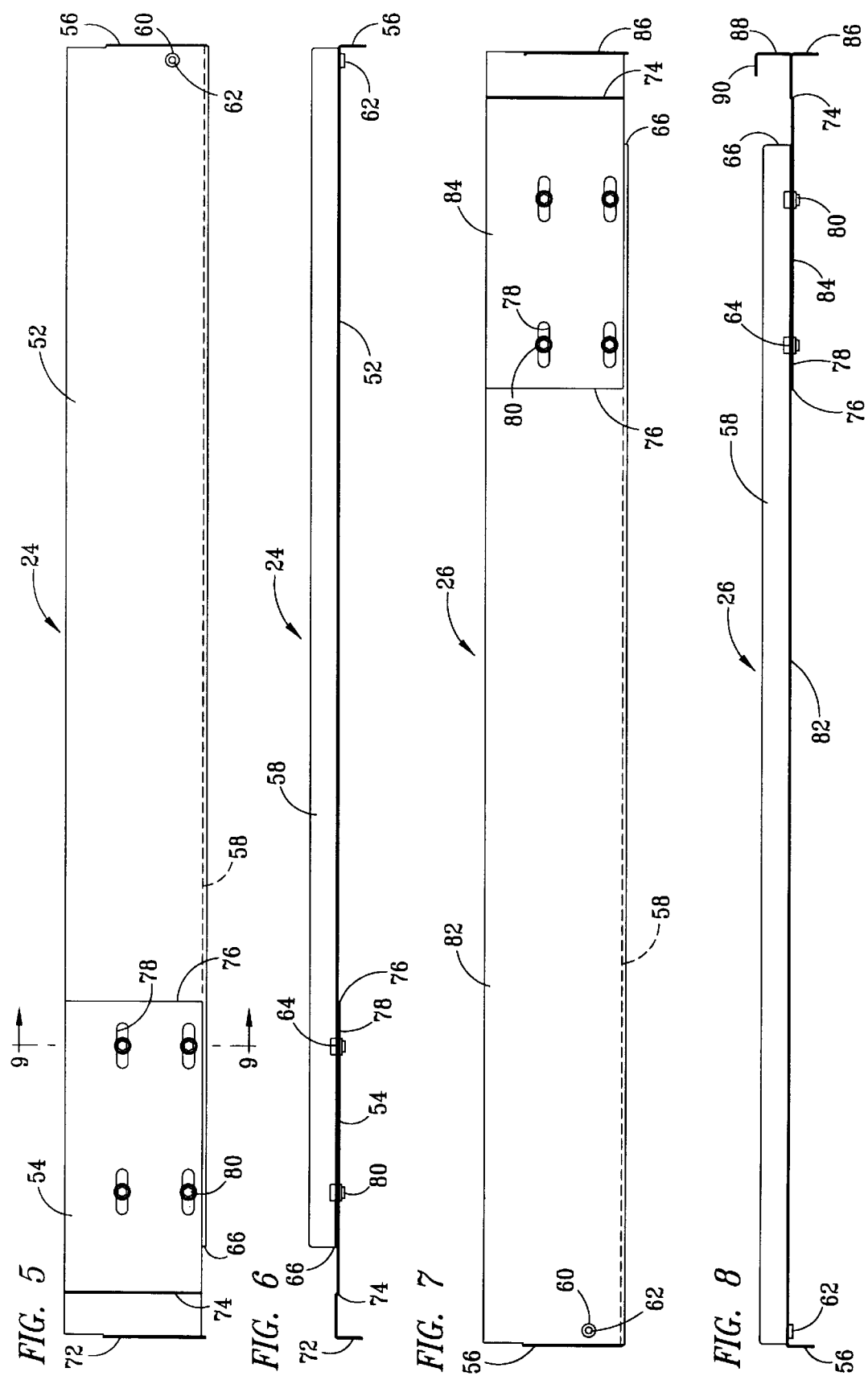

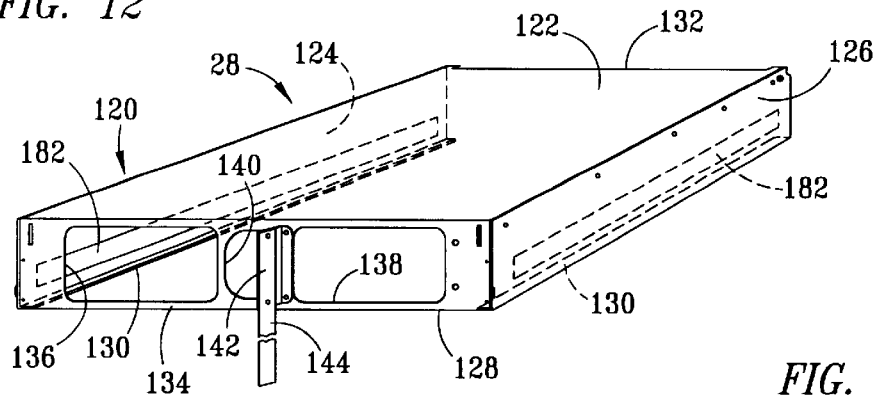
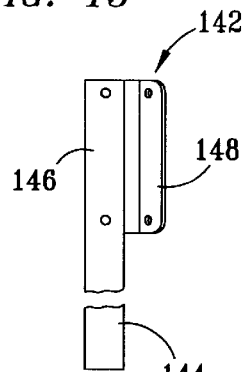
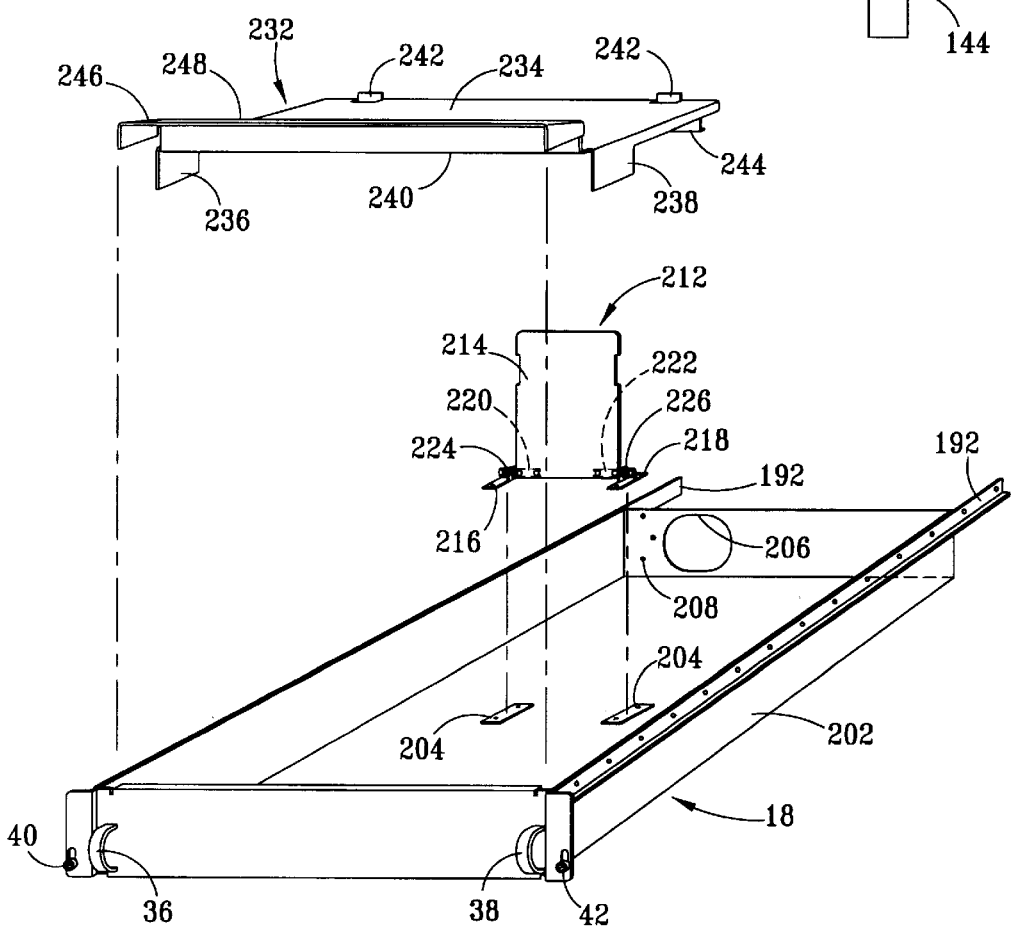

TWO U VERTICAL HEIGHT KEYBOARD AND FLATSCREEN DRAWER FOR A SERVER SYSTEM RACK

TECHNICAL FIELD OF THE INVENTION

The present invention relates in general to hardware for computer systems, and in particular to a keyboard and flatscreen monitor tray for server system racks.

BACKGROUND OF THE INVENTION

Server system racks have been provided for housing equipment, such as network server systems, telephone switch gear, power supplies, and the like. Industry standards have been adopted for server system racks, including the adoption of standard unit sizes for the widths and horizontal depths of system racks. One such standard rack size is nineteen inches in width. The height of components for installing into server racks is typically expressed in terms of a standard vertical unit of measure "U" which corresponds to 1.75 inches. Such components have included keyboards and video displays which together occupy large amounts of space. Flatscreen monitors and keyboards have also been mounted in single drawers with the flatscreen monitors being pivotally mounted to the drawers, such that the monitors may be raised for viewing once the drawer is pulled outward of the rack.

SUMMARY OF THE INVENTION

A shelf having self-adjusting mounting rails and a drawer which is slidably mounted to the shelf are provided for mounting in a server system rack. The mounting rails of the shelf are telescopically adjustable to vary the lengths of the mounting rails for accommodating racks having varying horizontal depths. Opposite ends of the mounting rails are rigidly fastened to the rack to fix the lengths of the mounting rails to fit the horizontal depth of the rack. The shelf further includes an enclosure which is fastened to the mounting rails. Telescoping, bearing slide assemblies are mounted to respective ones of opposite, interior sides of the enclosure and to opposite exterior sides of the drawer to slidably secure the drawer to the shelf for moving between an inward position, disposed substantially within the shelf, and an outward position, extending exteriorly of the shelf. A flexible cable arm is secured to the rear of the drawer and the rear of the shelf for securing cables which pass between the drawer and the enclosure. A keyboard and a flatscreen monitor are preferably mounted within the drawer. The flatscreen monitor is pivotally mounted to the drawer, such that when the drawer is disposed in the outward position, the monitor may be angularly moved between an upward, viewing position for viewing the monitor and a downward position, stowed within the drawer for sliding underneath the shelf. A monitor clutch is provided for supporting the monitor in the upward, viewing position.

BRIEF DESCRIPTION OF THE DRAWINGS

For a more complete understanding of the present invention and the advantages thereof, reference is now made to the following description taken in conjunction with the accompanying Drawings in which:

FIG. 5 is a side elevation view of a left side mounting rail for mounting the shelf, and the keyboard and monitor drawer to the rack of the cabinet;

FIG. 6 is a top view of the extensible left side mounting rail of FIG. 5;

FIG. 7 is a side elevation view of a right side mounting rail for mounting the shelf, and the keyboard and monitor drawer to the rack of the cabinet;

FIG. 8 is a top view of the right side mounting rail of FIG. 7;

FIG. 12 is a perspective view of an enclosure for mounting within the rack to provide the shelf;

FIG. 13 is a side elevation view of a cable guide bracket and a cable strap for securing keyboard, monitor and power cables;

FIG. 17 is an exploded view of the keyboard and monitor drawer, depicting various components thereof in perspective.

DETAILED DESCRIPTION OF THE INVENTION

Figure 1:
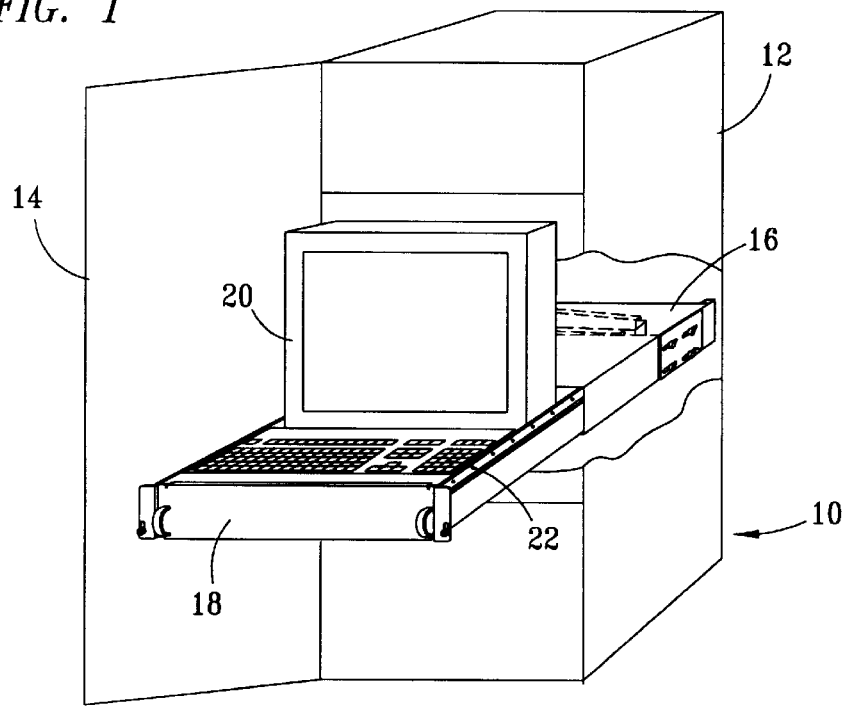
FIG. 1 is a cutaway view of a cabinet having a rack to which a shelf, and a keyboard and monitor drawer are mounted, showing the drawer in an intermediate position with the monitor disposed in a raised position.

FIG. 1 is a cutaway view of a cabinet 10, preferably for a computer network server system, having a rack 12 and a door panel 14 which is pivotally mounted to the rack 12. The rack includes a shelf 16 and a drawer 18, which is slidably mounted to the underside of the shelf 16. The drawer 18 is moveable from within the rack 12 and the shelf 16 between an inward position to an outward position. The drawer 18 is shown disposed in an intermediate position, which is disposed between the inward position and outward position. Preferably, the rack 12 is a nineteen inch wide rack. A monitor 20 and a keyboard 22 are mounted within the drawer 18. The monitor 20 is preferably a flatscreen monitor which is sized with a width which will fit within a nineteen inch wide rack, when mounted within the drawer 18. The drawer 18 occupies a vertical space of two "U" vertical units, with one vertical unit of measure ("U") being equal to 1.75 inches.

Figure 2:
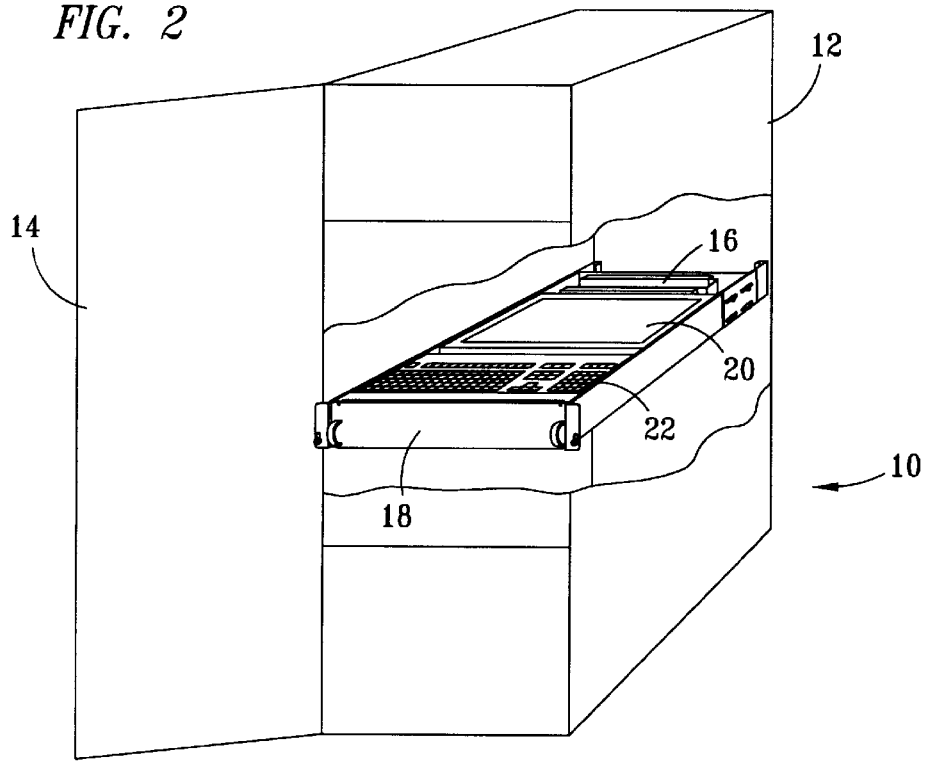
FIG. 2 is a cutaway view of the cabinet of FIG. 1, showing the drawer in an inward position, with a monitor disposed in a downward, stowed position.

FIG. 2 is a cutaway view of the cabinet 10, with the drawer 18 shown disposed in the inward position, substantially underneath the shelf 16 and substantially within the rack 12. The monitor 20 has been lowered into a downwardly disposed, stowed position, prior to moving the drawer 18 into the inward position. The drawer 18 must be moved from the intermediate position (shown in FIG. 1) to the outward position (shown in FIG. 3) so that the monitor 20 may be lowered into the downwardly disposed, stowed position.

Figure 3:
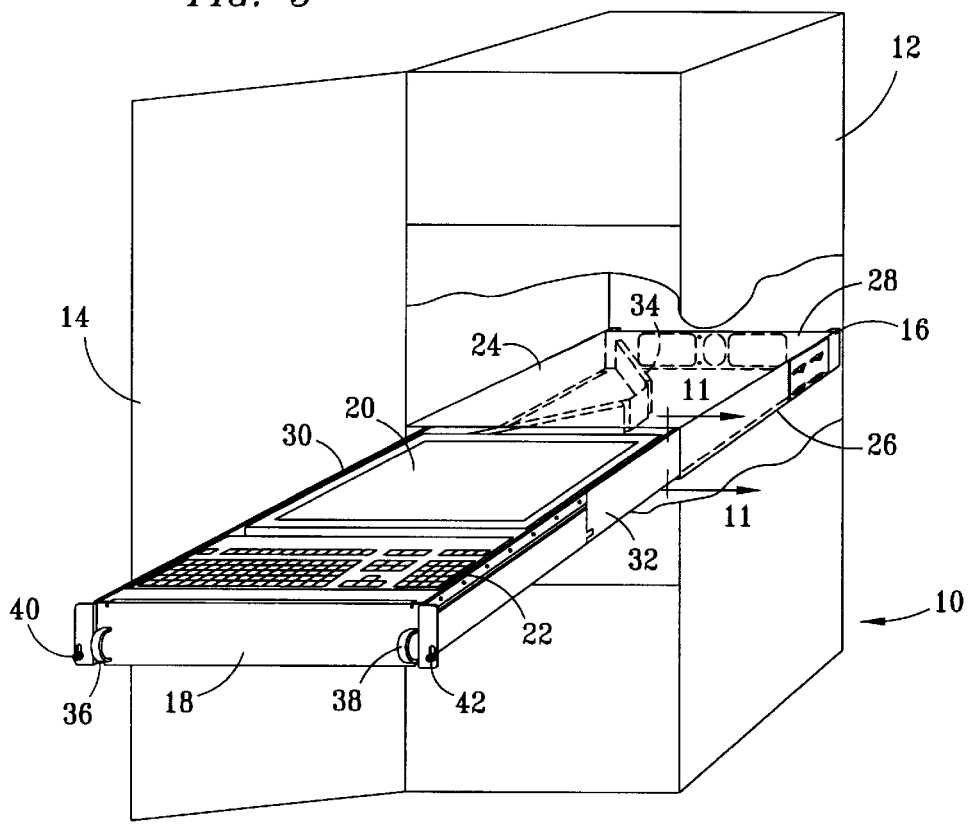
FIG. 3 is a cutaway view of the cabinet of FIG. 1, showing the drawer in an outward position.

FIG. 3 is a cutaway view of the cabinet 10, showing the drawer 18 after it has been pulled outward from underneath the shelf 16 and from within the rack 12 to the fully outward position, in which the drawer 18 is substantially disposed outward from underneath the shelf 16 and outward of the rack 12. The monitor 20 is shown in the downward position. The drawer 18 must preferably be fully in the outward position for the monitor to be moved from the downward, stowed position. The shelf 16 is provided by two mounting rails 24 and 26, and an enclosure 28. The two mounting rails 24 and 26 are disposed on opposite sides of the enclosure 28 and the drawer 18, and are extensible for self-adjusting to mount directly to rack 12. The enclosure 28 is mounted to the mounting rails 24 and 26 and houses telescoping, ball bearing slide rail assemblies 30 and 32 for slidably mounting the drawer 18 underneath, or within, the enclosure 28 of the shelf 16. The drawer 18 is mounted to the bearing slide assemblies 30 and 32 for moving from the inward position, in which the drawer is substantially disposed beneath the shelf 16, to the outward position, in which the drawer is disposed substantially outward from beneath the shelf 16. Opposite ends of a flexible cable arm 34 are secured directly to the rearward end of the enclosure 28 and the rearward end of the drawer 18. The flexible cable arm 34 is flexible such that it will move between extended and retracted positions as the drawer is moved inward and outward of the enclosure 28 and the rack 12. The flexible cable arm 34 has multiple linkages which are preferably pivotally connected for pivotally moving relative to one another and parallel to a single plane within which the drawer moves in moving between the inward and outward positions. The forward end of the drawer 18 has handles 36 and 38, and latches 40 and 42. The latches 40 and 42 are preferably provided by captivated thumb screws for securing the drawer 18 to the rack 12, within the enclosure 28, when the drawer 18 is moved into the inward position, within the enclosure 28 and the rack 12.

Figure 4:
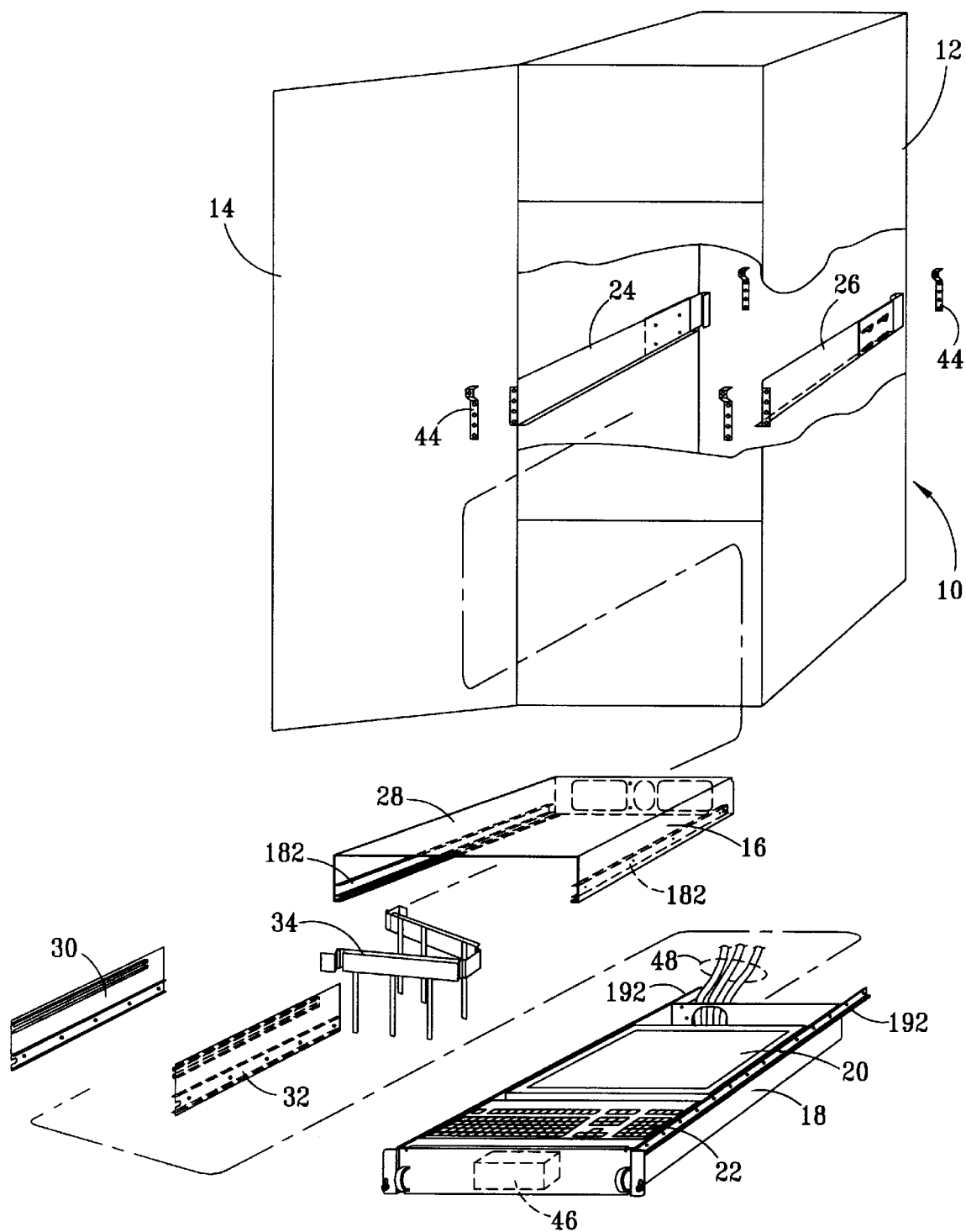
FIG. 4 is an exploded view of the cabinet and drawer, showing the cabinet in a cutaway view and showing various components of the drawer in perspective.

FIG. 4 is an exploded, perspective of the cabinet 10. The shelf 16 includes the self-adjusting mounting rails 24 and 26, which are shown extending within the rack 12. Four bar nuts 44 are provided for mounting respective ends of the two mounting rails 24 and 26 to the rack 12. The mounting rails 24 and 26 are selectively extensible to automatically adjust in length for fitting with the horizontal depth of the rack 12, such that the mounted rails 24 and 26 are self-adjusting during mounting to automatically accommodate, or fit within, racks of various horizontal depths. The shelf 16 further includes the enclosure 28, which is a structure having an open bottom, a closed top, two closed sides, an open forward end and a partially enclosed rearward end. The flexible cable arm 34 has opposite ends which are mounted to respective ones of the rearward end of the enclosure 28 and the rearward end of the drawer 18. The telescoping, ball bearing slide assemblies 30 and 32 are slidably mounted to the interior of the enclosure 28 and to the sides of the drawer 18. Preferably, the telescopically adjustable lengths of the side rails 24 and 26, and the direction which the drawer 18 is moved when mounted to said slide assemblies 30 and 32, are parallel, and extend within a singular plane within which the linkages of the cable arm 34 are pivotally moved. The drawer 18 is shown with the flatscreen monitor 20 stowed in the downward position, disposed in a rearward portion of the drawer. The keyboard 22 is mounted to a forward portion of the drawer 18. Also disposed in the forward portion of the drawer 18 is a power supply 46 for powering the flatscreen monitor 20. Three cables 48 extend rearward from the tray 202, providing data cables from the monitor 20 and keyboard 22, and a power cable for connecting the power supply 46 to a power source.

FIG. 5 is a side elevation view, and FIG. 6 is a top view, of a left side mounting rail 24 for mounting the shelf 16 to the rack 12 (shown in phantom in FIGS. 1–4). The self-adjusting mounting rail 24 mounts directly to the rack 12. The mounting rail 24 includes a first section 52 and a second section 54. Flanges 56 and 58 are provided on the first section 52. The flange 56 extends vertically for mounting the rail 24 to the forward end of the rack 12, with the flanges 56 and 58 disposed between the bar nuts 44 and a mounting rail of the rack 12. The flange 58 extends horizontally and longitudinally along the length of the first section 52, providing a horizontal mounting surface for slidably receiving and then supporting the enclosure 28. The horizontally extending flange 58 extends the full longitudinal length of the first section 52 of the left side mounting rail 24. A hole 60 extends through the vertically extending sidewall of the first section 52 and a threaded nut 62 is mounted to the outward side of the first section 52, such that the nut 62 extends around the hole 60 for receiving a mounting screw which secures the forward end of the enclosure 28 to the left side mounting rail 24. Four holes 64 are spaced apart and are provided through the vertically extending sides of the first section 52 of the left side mounting rail 24. The holes 64 are provided for aligning with slots 78 in the second section 54 of the left side mounting rail 24, which is discussed below in more detail. The first section 52 has a rearward, terminal end 66.

The second section 54 of the left side longitudinally adjustable mounting rail 24 includes a rearward flange 72 which extends vertically for mounting directly to the rack 12. The second section 54 also has a bend or fold 74 formed into a vertical wall therefor and extending between the flange 72 and the forward terminal end 76 of the second section 54. Four slots 78 are formed in the vertical sidewall of the second section 54 and are disposed in a spaced apart alignment to extend in the longitudinal direction of the mounting rail 24. The four slots 78 are aligned for registering with the four spaced apart holes 64 of the first section 52 for cooperatively receiving respective ones of bearing sleeve assemblies 80. The bearing sleeve assemblies 80 connect the first section 52 to the second section 54, such that the first section 52 is slidably engaged with the second section 54 for slidably moving in the direction of the longitudinal lengths of the slots 78. The longitudinal lengths of the slots 78 preferably correspond to the longitudinal length of the mounting rails 24 and 26, which correspond to the horizontal depth of the rack 12.

FIG. 7 is a side elevational view of right side mounting rail 26, and FIG. 8 is a top view of the right side mounting rail 26. The right side mounting rail 26 includes a first section 82 and a second section 84. The first section 82 has a forward, vertically extending flange 56 and rearward terminal end 66. A horizontally extending flange 58 extends the full, longitudinal length of the first section 82. A hole 60 is formed through the vertically extending sidewall of the first section 82 and a threaded nut 62 is mounted to an outward side of the first section 82, such that the threaded nut 62 is aligned for receiving a fastening screw for mounting the forward end of the enclosure to the right side mounting rail 26. Four holes 64 are provided through the vertically extending sidewall of the first section 82 and are aligned for registering with the four slots 78 of the second section 84. The second section 84 has rearward flange 86 on the terminal end thereof, which includes a T-shaped section 88 and a vertically extending flange 90. The vertically extending flange 90 is disposed at a right angle to the vertically extending surface of the T-shaped section 88. The flange 56 and the section 88 are secured between the bar nuts 44 and the frame of the rack 12. Four slots 78 are provided with longitudinal lengths that preferably extend parallel to the longitudinal length of the mounting rail 26. The four slots 78 are aligned for registering with the four holes 64 formed through the vertical sidewall of the first section 82. The four holes 64 register with the four slots 78 for receiving the bearing sleeve assemblies 80 to slidably couple the first section 82 to the second section 84, with the second section 84 being slidable relative to the first section 82 for the longitudinal lengths of the slots 78.

Figure 9:
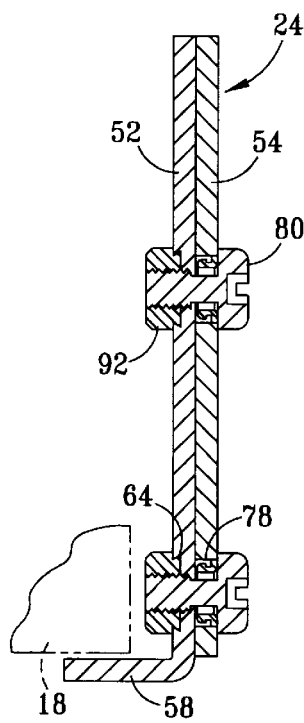
FIG. 9 is a sectional view of the left side mounting rail, taken along Section Line 9—9 of FIG. 5.

FIG. 9 is a sectional view of the left side mounting rail 24, taken along section 9—9 of FIG. 5. Four of the bearing sleeve assemblies 80 (two shown) are mounted within respective ones of the slots 78 and the holes 64. The first section 52 is disposed inside of the second section 54. The horizontally extending flange 58 is shown extending inward from the bottom of the first section 52. The second section 54 is slidably coupled to the first section 52 by the four bearing sleeve assemblies 80 (two shown). A threaded nut 92 is used for coupling the bearing sleeve assembly 80 to the first section 52 and the second section 54 of the mounting rail 24. The right side mounting rail 26 is configured similar to the left side mounting rail 24, with the exception of the flange 58 of the right side mounting rail extends inward, in an opposite facing direction to that of the flange 58 of the left side mounting rail 24, and the first section 82 is disposed inside of the second section 84. The flange 58 provides a surface upon which the drawer 18 (shown in a cutaway view) may slide and rest during installation of the slide assemblies 30 and 32.

Figure 10:
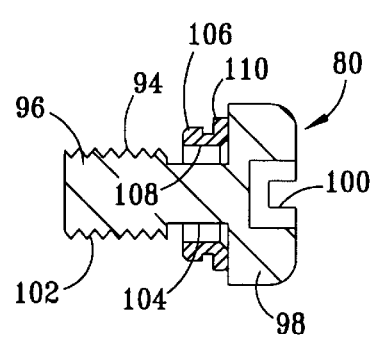
FIG. 10 is a longitudinal section view of a bearing sleeve assembly for use in the right and left side mounting rails, taken along Section Line 9—9 of FIG. 5.

FIG. 10 is a longitudinal section view of one of the bearing sleeve assemblies 80. The bearing sleeve assembly 80 includes a threaded fastener 94 having a shank 96 and head 98. The head 98 has a combination torx drive and single slot drive connection 100 formed into the same hole, such that the connection 100 can be coupled to and driven by either a torx drive or a flat head screw driver. An end 102 of the shank 96, which is opposite the head 98, is threaded for coupling to one of the threaded nuts 92 (shown in FIG. 9). A bearing surface 104 is provided on the intermediate portion of the shank 96, which is adjacent to the head 98. An annularshaped bearing sleeve 106 has an inner bearing surface 108 which extends around the upward bearing surface 104 of the shank 96, adjacent to the head 98. An outer bearing surface 110 of the bearing sleeve 106 will engage within the slot 78 of the second section 54 to provide a rolling surface for relative movement between respective ones of the first section 52 and the second section 54, and the first section 82 and the second section 84, for extending and retracting the mounting rails 24 and 26.

Figure 11:
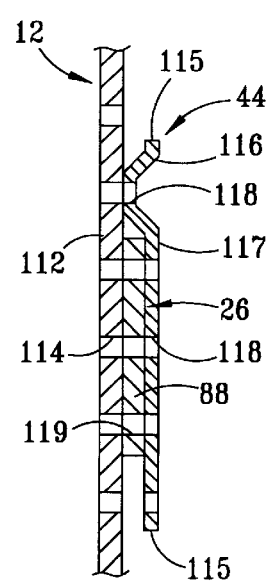
FIG. 11 is a sectional view of a mounting rail of the rack and a bar nut bracket for mounting the right said mounting rail to the rack, taken along Section Line 11—11 of FIG. 3.

FIG. 11 is a sectional view of one of four cabinet bay mounting rails 112 of the rack 12 and one of the four bar nut brackets 44 for mounting the right said mounting rail 26 to the rack 12, taken along Section Line 11—11 of FIG. 11. The mounting rails 112 preferably extend for the vertical height of the rack 12, one on each of the four corners of each bay of the rack 12 to provide flanges for rigidly securing various members to the rack 12. The mounting rails 112 have holes 114 which are spaced apart for the full height of the mounting rails 112. The bar nut brackets 44 have upper and lower terminal ends 115. A U-shaped section 116 is secured to fit flush against the mounting rails 112 and formed to provide an offset section as a means for spacing apart a straight section 117 of the bracket from the rail 112. The straight section 117 extends from the U-shaped section 116, spaced apart from the mounting rail 112 of the rack 12 for fitting a tab means provided by the flange 86 of the T-shaped section 88 of the right side mounting rail 26. Five threaded holes 118 are provided in the bar nut bracket 44. Three of the holes 118 are aligned for registering with three of the holes 119 of the tab portion of the flange 86 and three of the holes 114 in the cabinet bay mounting rails 112. The one of the threaded holes 118 disposed in the U-shaped section 116 is aligned with one of the holes 114 in the cabinet bay mounting rail 112 to secure the bar nut bracket to the rack 12. One of the threaded holes 118 in the straight portion 118 of the bracket 44 is aligned with one of the holes 114 for receiving a threaded shank of the captivated thumb screw used for the latch 42 (shown in FIG. 3).

The longitudinal terminal ends of the mounting rails 24 and 26 are secured by respective ones of the four flanges 56 and 86 to respective ones of the bar nut brackets 44 and the mounting rails 112 of the rack 12, with two screws threadingly engaging the holes 118 of the brackets 44 for each of the four flanges 56 and 86. Thus, the self-adjusting mounting rails24 and 26 are easily mounted within the rack 12, by first securing the bar nut brackets 44 to the cabinet bay mounting rails 112, then fitting the longitudinal length of the mounting rails 24 and 26 to match the horizontal depth of the cabinet 12 using the telescoping, self-adjusting feature of the mounting rails 24 and 26, and lastly securing the four flanges 56 and 86 of the four terminal ends of the mounting rails 24 an 26 to respective ones of the cabinet bay mounting rails 112 using two screws to engage the threaded holes 118 of the bar nut brackets 44.

FIG. 12 is a cutaway view of the enclosure 28 for use in mounting the drawer 18 to the rack 12 to provide the shelf 16. The enclosure 28 comprises a metal fabrication 120 which, when oriented as viewed from the front of the cabinet 10 when installed therein, has a top 122, a right side 124, a left side 126 and an open bottom 128. Flanges 130 are horizontal and formed to extend inward from respective ones of the right side 124 and the left side 126, into the open bottom 128. The enclosure 28 further has an open forward end 132 and a partially enclosed rearward end 134. The rearward end 134 is formed from a solid, planar sheet having a rectangular port 136, a rectangular port 138, and an oval or round port 140. A cable guide bracket 142 is mounted to the rearward end 134.

FIG. 13 is a side elevation view of the cable guide bracket 142. The cable guide bracket 142 includes the cable strap 144 which has a VELCRO™ connection on the upper and lower ends, a mounting plate 146 and a guide flange 148. The mounting plate 146 has a planar surface for fitting flush against the planar rearward end 134 of the enclosure 28. The guide flange 148 extends at an angle of approximately thirty degrees (30°) to the planar surface of the mounting plate 146 for mounting at an angle to the rearward end 134 of the enclosure 128 (shown in FIG. 12), for guiding the keyboard, monitor and power cables at an angle from the rearward end 134, to prevent these cables from hitting the rearward end of the rack 12. The cable strap 144 is wrapped around the guide flange 148 and the ends thereof are secured together, to secure the keyboard, monitor and power cables therein, with the strap 144 being wrapped around a guide flange 148 of the cable guide bracket 142.

Figure 14:
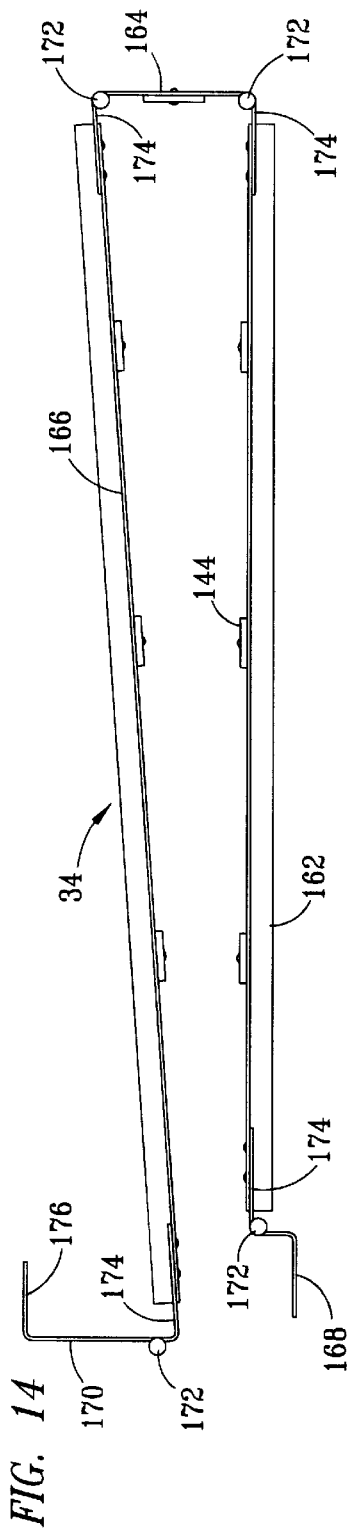
FIG. 14 is a top view of a flexible cable arm having interconnecting linkages which are pivotally connected to the rearward end of the drawer and to a rear portion of the rack.
Figure 15:
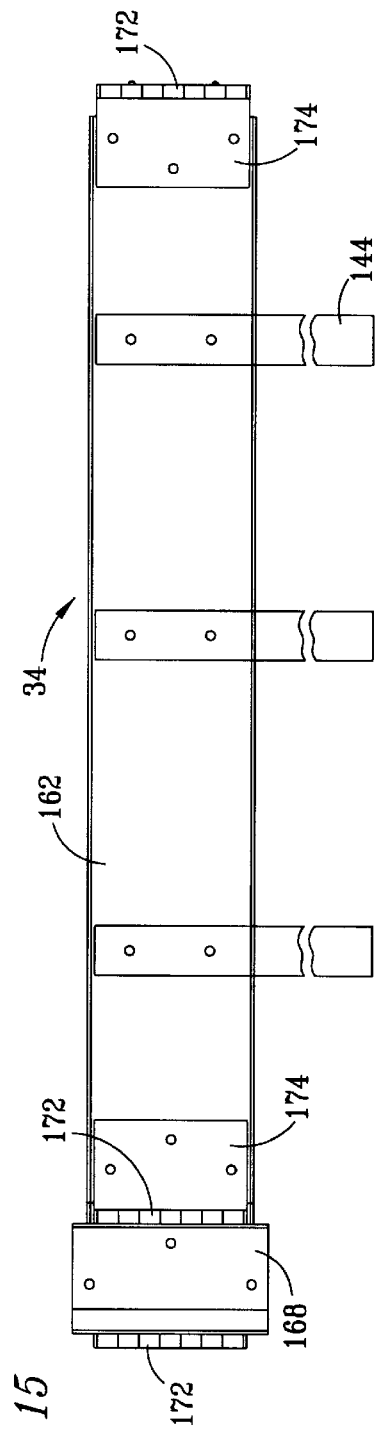
FIG. 15 is a side elevation view of the cable arm.

FIG. 14 is a top view and FIG. 15 is a side elevation view of the cable arm 34. The cable arm 34 includes a forward linkage 162, an intermediate linkage 164 and a rearward linkage 166. The cable arm 34 further includes a forward mounting bracket 168 and a rearward mounting bracket 170. The forward linkage 162 is preferably shorter than the rearward linkage166, and the intermediate linkage 164 is significantly shorter than the forward linkage 162 and the rearward linkage 166. Four hinges 172 interconnect respect ones of the forward mounting bracket 168, the forward linkage 162, the intermediate linkage 164, the rearward linkage 166 and the rearward mounting bracket 170. A plurality of flat plate mounting brackets 174 are utilized for mounting the hinges 172 to respective ones of the above linkages and brackets 162 through 170. The cable arm is flexible since linkages 162, 164 and 166 are pivotally connected for angularly moving relative to one another within a singular horizontal plane which is parallel to a horizontal plane within which said drawer 18 moves relative to said rack 12. The forward mounting bracket 168 is connected directly to the rearward end of the drawer 18 and the rearward mounting bracket 170 is connected directly to the rearward end 134 of the enclosure 28. The rearward mounting bracket 170 further includes an outward flange portion 176. The outward flange portion 176 provides a planar surface which is mounted flush against the forward facing side of the partially enclosed rearward end 134 of the enclosure 28. Quick-release fasteners are preferably used for connecting the rearward mounting bracket 170 to the rearward end 134 of the enclosure 28. The fasteners provide a quick release for quickly coupling and quickly releasing the cable arm 34 from the rearward end 134 of the enclosure 28 during assembly and during removal of the drawer 18 from within the rack 12. A plurality of the cable straps 144 are mounted to the linkages 162, 164 and 166 for wrapping around respective ones of the linkages 162, 164 and 166 to secure the keyboard, monitor and power cables to the cable arm 34. The cable arm 34 provides a means for holding the three cables and preventing the three cables from being entrapped between the drawer 18 and the enclosure 28 as the drawer 18 is moved between the intermediate, inward and outward positions (shown in FIGS. 1 through 3, respectively).

Figure 16:
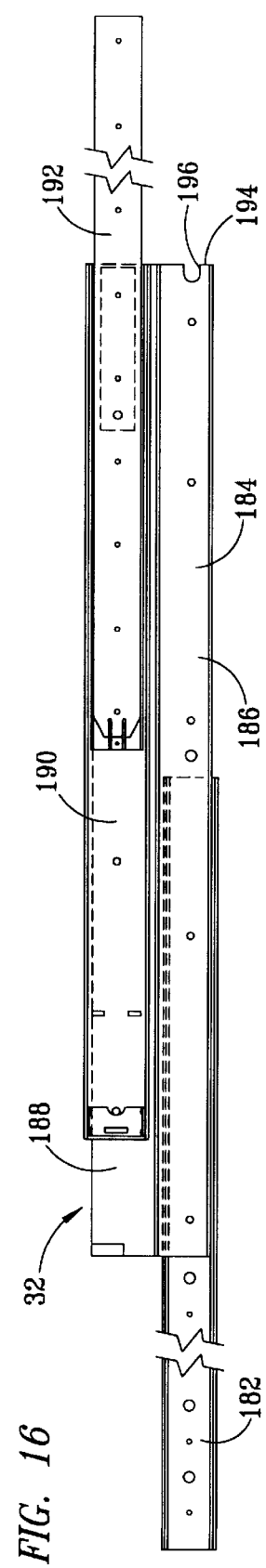
FIG. 16 is a side elevation view of a telescoping, ball-bearing slide rail for slidably mounting the keyboard and monitor drawer to the enclosure and the rack.

FIG. 16 is a side elevation view of the telescoping, ball bearing slide rail assembly 32, which mounts to the interior of the right vertical sidewall 124 of the enclosure 28 and the exterior of the right vertical sidewall of the drawer 18. The telescoping, ball bearing slide rail assembly 30 is constructed similarly to the slide rail 32, except being oriented for mounting to an opposite side of the drawer 18. The slide rail 32 includes a rack rail 182 which is rigidly mounted directly to the interior of the enclosure 28. The bearing housing 184 includes a lower track 186 and an upper track 188 which have ball bearings for slidably receiving respective ones of the rack rail 182 and the drawer rail 192. The drawer rail 192 is rigidly mounted directly to the sides of the drawer 18, and is slidably engaged within the upper track 188 for riding upon ball bearings housed within the slide rail bearing housing 184. The forward end 194 of the bearing housing 184 has a notch 196. This notch 196 is used for passing a mounting screw by which the enclosure 28 is rigidly secured to the mounting rails 26, and thereby to the rack 12. A second notch 196 (not shown) is also provided in the forward end of the telescoping, ball bearing slide rail assembly 30 for passing a mounting screw for mounting the enclosure 28 to the mounting rail 24. A latch engages the drawer rails 192 in an outward position relative to the housing 184. The housing 184 preferably does not have a latch to maintain the housing 184 in a selected position relative to the drawer slide rail 182.

FIG. 17 is an exploded, cutaway view of the keyboard and monitor drawer 18. The drawer 18 includes in a tray 202, which is preferably formed of a metal fabrication. Two raised mounting surfaces 204 are provided at a height that is spaced above the bottom of the tray 202. An opening 206 is provided in the rearward end of the tray 202 for passing the keyboard, monitor and power cables. Three holes 208 are provided for mounting the forward mounting bracket 168 of the cable arm 34 to the rearward end of the tray 202. A monitor platform 212 is provided for mounting the flatscreen monitor 20 to the tray 202. The monitor platform 212 includes a back plate 214 and two mounting brackets 216 and 218. The backside of the flatscreen monitor 20 is mounted to the backplate 214. The mounting brackets 216 and 218 provide mounting feet which fit flush against the two raised mounted surfaces 204 formed into the bottom of the tray 202. Two backplate brackets 220 and 222 rotatably secure the back plate 214 to respective ones of the mounting brackets 216 and 218. Clutch assemblies 224 and 226 are mounted to respective ones of the brackets 216 and 218, and the two backplate brackets 220 and 222. The clutch assemblies 224 and 226 provide frictional engagement members which retain the back plate 214 and the flatscreen monitor 20 in an upright position.

Also included in the drawer 18 is a keyboard mounting platform 232. The platform 232 is provided by a metal fabrication 234 having standoffs 236 and 238 which space apart the upper platform surface of the platform 232 from the bottom of the tray 202 providing a space 240 therebetween. Power supply 46 (shown in FIG. 4) for the monitor 20 is mounted in the space 240. Two tabs 242 provide a stop on the rearward end on the platform 232. A mounting bracket 244 extends downward for mounting the rearward end of the platform 232 to the bottom of the tray 202. A raised surface 246 is provided in the forward end of the platform 232, and preferably includes a gel-type wrist pad 248.

Figure 18A:
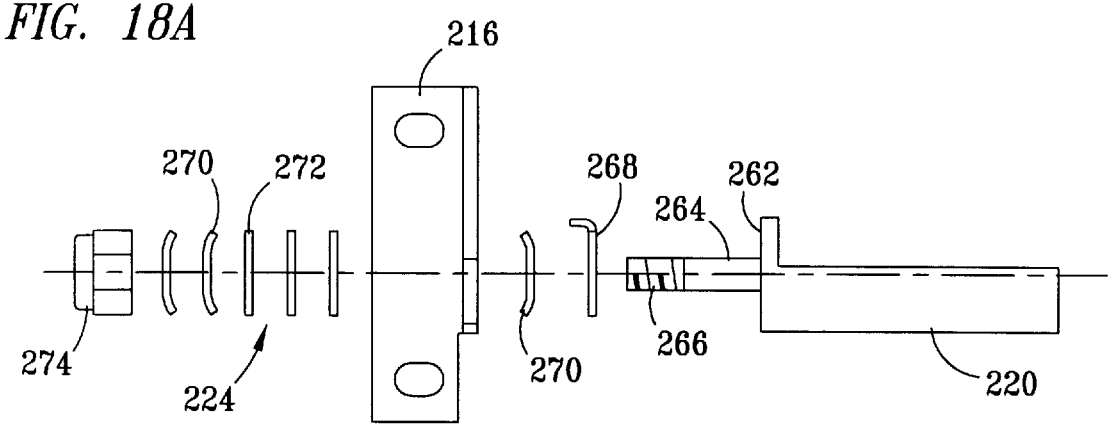
FIGS. 18A and 18B are exploded views depicting two clutch assemblies for pivotally mounting the monitor to the drawer, and retaining the monitor in selected angular positions when the flat screen monitor is disposed in such positions.
Figure 18B:
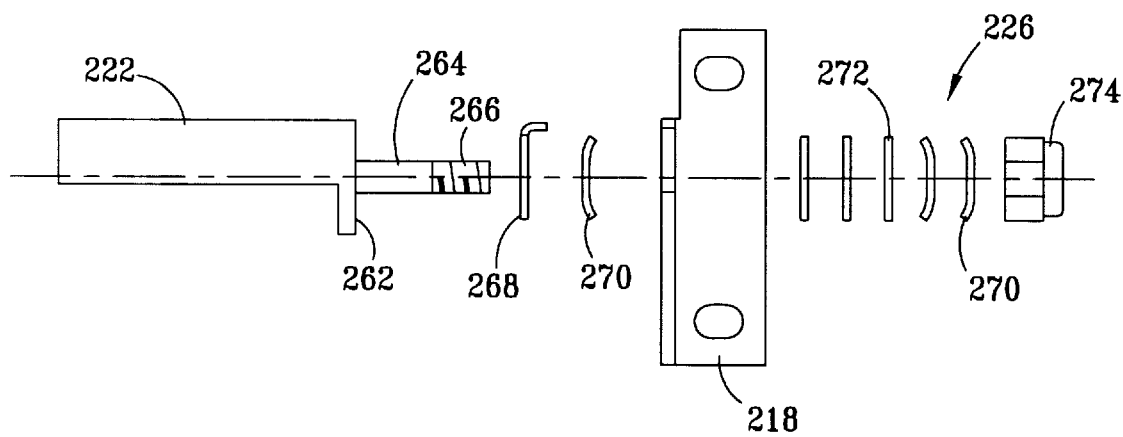

FIGS. 18A and 18B are exploded top views of the two clutch assemblies 224 and 226, respectively. The mounting brackets 216 and 218 mount directly to the raised mounting surfaces 204 of the bottom of the tray 202 of the drawer 18. The backplate brackets 220 and 222 each have a shoulder 262. The backplate mounting brackets 222 and 220 each also include a shank 264 with a threaded outward end 266. A bracket washer 268 has a flat portion which mounts directly against the shoulder 262, and an outward end which extends at a right angle to the flat portion and engages the top of respective ones of the brackets 216 and 218, to provide a stop which engages the tops of respective ones of the brackets 216 and 218. Belleville-type washers 270 and flat washers 272 are secured between the nuts 274 and respective ones of the mounting brackets 216 and 218 to provide a spring force which presses the flat washers 272 against the upwardly extending surfaces of respective ones of the brackets 216 and 218. The belleville-type washers 270 push against the outer perimeter portions of the flat washers 272, which press against the upwardly extending surfaces of respective ones of the brackets 216 and 218 provide the frictional engagement for retaining the backplate 212 and the flatscreen monitor in an upright position relative to the drawer 18. The belleville-type washers 270 and the flat washers 272 together provide a frictional engagement means having frictional engagement members, or retaining members, for retaining the backplate 214 in a selected angular position relative to the tray 202.

In operation, the two self-adjusting mounting rails 24 and 26 are first mounted within the rack 12. During placement into the rack 12, the two selfadjusting mounting rails 24 and 26 are preferably free to telescopically extend and retract, until the opposite longitudinal ends of the mounting rails 24 and 26 are secured to opposite ends of the rack 12. The forward and rearward ends of the mounting rails 24 and 26 together have four flanges 56 and 86 which are threadingly secured to the rack 12, with the flanges 56 and 86 fitting between the cabinet mounting rail 112 of the rack 12 and the bar nuts 44. The enclosure 28 is then secured into the rack 12 to provide the shelf 16, with the lower edges of the enclosure 28 fitting upon the two inwardly extending, horizontal flanges 58 of the mounting rails 24 and 26. Two screws secure the forward end of the enclosure 28 to respective ones of the mounting rails 24 and 26. The rack rails 182 are mounted to the inward facing surfaces of the sidewalls of the enclosure 28. The two bearing housings 184 of the telescoping slide assemblies 30 and 32 may be installed to the rack with the enclosure 28, or, in the alternative, the two bearing housings 184 of the assemblies 30 and 32 may be installed into the enclosure 28 after the enclosure 28 is mounted to the rack 12.

Preferably, the keyboard 22, the flatscreen monitor 20, the power supply 46, the cable arm 34 and the slide rails 192 are first mounted to the tray 202 of the drawer 18. Next, the three cables for respective ones of the monitor 20, the keyboard 22 and the power supply 46 are attached to the cable arm 34 with the cable straps 144. Then, the slide rails 192 are engaged within the slide housing 190 and the drawer 18 is moved rearward and partially within the enclosure 28 to moveably secure the drawer 18 to the shelf 16. The end of the cable arm 34 is then secured to the rearward end of the enclosure 28 with the quick fasteners 150. The keyboard, monitor and power cables are feed through the port 140, being diverted by the guide flange 148 of the guide bracket 142 to extend from within the enclosure 28 at a sixty degree angle to the planar surface of the partially enclosed rearward end 134 of the enclosure 28. The ports 136 and 138 provide access for viewing the cable arm 34 and reaching within the enclosure 28 from rearward of the drawer 18 to guide the rearward end of the cable arm 34 for securing to the right side of the rearward end 134 and guiding the three cables through the port 140. The handles 36 may be grasped for gripping the drawer, and the latches 40 and 42 may be threadingly secured to the threaded holes in the forward two of the bar nuts 44, to fasten the drawer 18 within the shelf 16 and the rack 12. The drawer 18 is then operational for moving between the inward, intermediate and outward positions, relative to the shelf 16 and the rack 12, after releasing the latches 40 and 42.

During use, the drawer will be initially in the position shown in FIG. 2, with the monitor 20 in the downward, stowed position and the drawer 18 in the inward position, substantially within the rack 12. Then, the drawer will be extended outward to the fully outward position as shown in FIG. 3, providing clearance for the flatscreen monitor 20 to be pivoted upwards to the upright position, as the monitor is shown in relation to the drawer 18 in FIG. 1. Then, the drawer will be pushed backwards to the intermediate position as shown in FIG. 1, such that the monitor 20 is in the upright position and in front of the rack 12. The clutch assemblies 224 and 226 will hold the flatscreen monitor in the upright position, or in an intermediate position between the downward stowed position and the upright position. To lay the monitor flat again, the drawer 18 is pulled outward to the fully outward position shown in FIG. 3, and the monitor 20 will be moved downward to the stowed position shown in FIG. 3. Then, the drawer 18 will be moved inward to the inward position shown within the rack 12 in FIG. 2.

The drawer 18 of the present invention is provided having a two "U" vertical height, preferably for use in 19 inch wide racks. The drawer 18 is mounted within a shelf 16 provided by the enclosure 28, which is mounted within the rack by selfadjusting mounting rails 24 and 26. Two slide rails 182 are rigidly mounted to opposite, interior sides of the enclosure 28. The telescoping slide rail bearing assemblies 30 and 32 are then slidingly mounted to the two side rails 182, to telescopically extend from within the enclosure 28. The bearing assemblies 30 and 32 each include a sliding bearing housing 190, which is slidingly mounted a main bearing housing of the two bearing assemblies 30 and 32. The slide rails 192 are rigidly mounted directly to the sides of the drawer 18, and then the slide rails 192 are slidingly engaged within sliding bearing housing 190, which slidingly engages the slide rail bearing assemblies 30 and 32. A flexible cable arm 34 is provided for retaining the three cables, which are the keyboard, monitor and power cables. The cable arm 34 is flexible for extending and retracting between the rear of the tray 18 and the rearward end of the enclosure 28. The flatscreen monitor 20 is pivotally mounted to the drawer 18 by means of the backplate bracket 212, the two mounting brackets 216 and 218, the two backplate mounting brackets 220 and 262, and the clutch assemblies 224 and 226. A keyboard 22 is also mounted within the drawer 18. A power supply 46 for powering the monitor 20 is mounted directly underneath the keyboard 22 within the drawer 18.

Although the preferred embodiment has been described in detail, it should be understood that various changes, substitutions and alterations can be made therein without departing from the spirit and scope of the invention as defined by the appended claims.

What is claimed is:

1. A cabinet having a rack for mounting at least part of a data processing system, said cabinet comprising:

two mounting rails each having first and second sections which are free to slidably move relative to one another for telescopically adjusting longitudinal lengths of said two mounting rails for fitting the horizontal depth of said rack, and opposite ends of respective ones of said first and second sections having mounting portions for rigidly fastening to said rack to dispose said mounting rails in fixed, stationary positions relative to said rack;

a drawer having a tray and slide rail attachments;

slide assemblies mounted to respective ones of said two mounting rails and to said slide rail attachments of said drawer, for slidably moving said drawer relative to said rack, between an outward position, in which said drawer extends outward of said rack, and an inward position, in which said drawer is substantially disposed within said rack;

a cable arm having a plurality of linkages which are pivotally connected, said plurality of linkages together having a first end and a second end, wherein said first end is pivotally fastened to said rack at a first fixed position relative to said rack and said second end is pivotally fastened to said drawer at a second fixed position relative to said drawer, wherein said plurality of linkages extend from said first fixed position to second fixed position as said drawer is moved between said inward and outward positions relative to said rack;

cable fasteners for securing monitor and keyboard cabling to said linkages of said cable arm;

a keyboard mounted to said drawer for moving with said drawer from said inward position to said outward position;

a monitor which is moveably mounted to said drawer for moving with said drawer from said inward position to said outward position, and then moving said monitor from a downwards position to an upwards position to move said monitor from a stowed position, in which a screen of said monitor extends within said drawer, to a viewing position, in which said monitor screen extends transverse to a length of said drawer; and a monitor clutch mounted to said drawer and said monitor, and having a retaining member which engages between said drawer and said monitor to retain said monitor in at least one of said upwards position and said downwards position.

2. The cabinet of claim 1, wherein each of said two mounting rails further comprises:

a fastener body having a shank and a head, said shank extending outward from said head and said head being of a larger size than a portion of said shank adjacent to said head;

said first section having a hole formed there-through for passing said shank of said fastener body transversely through said first section and fitting said head against said first section; and said second section having a slot formed therein, extending in a direction having a component which extends along a respective one of said longitudinal lengths of said two mounting rails, wherein said shank of said fastener body is slidably received within said slot.

3. The cabinet of claim 2, further comprising said fastener bodies each including a roller having an inner bearing surface which is rotatably mounted to a respective one of said shanks of said fastener bodies, and an outer bearing surface which fits within said slot of a respective one of said second sections and moveably engages said shank and said respective one of said first sections to said second section.

4. A cabinet having a rack for mounting at least part of a data processing system, said cabinet comprising:

two mounting rails each having first and second sections which are free to slidably move relative to one another for telescopically adjusting longitudinal lengths of said two mounting rails for fitting the horizontal depth of said rack, and opposite ends of respective ones of said first and second sections having mounting portions for rigidly fastening to said rack to dispose said mounting rails in fixed, stationary positions relative to said rack;

a drawer having a tray and slide rail attachments;

slide assemblies mounted to respective ones of said two mounting rails and to said slide rail attachments of said drawer, for slidably moving said drawer relative to said rack, between an outward position, in which said drawer extends outward of said rack, and an inward position, in which said drawer is substantially disposed within said rack;

a cable arm having a plurality of linkages which are pivotally connected, said plurality of linkages together having a first end and a second end, wherein said first end is pivotally fastened to said rack at a first fixed position relative to said rack and said second end is pivotally fastened to said drawer at a second fixed position relative to said drawer, wherein said plurality of linkages extend from said first fixed position to second fixed position as said drawer is moved between said inward and outward positions relative to said rack;

cable fasteners for securing monitor and keyboard cabling to said linkages of said cable arm; and wherein said plurality of linkages of said cable arm comprise together three linkages which are pivotally interconnected one to another, with said first end of said plurality of linkages being a first linkage end of one of said plurality of said three linkages which is fastened to said rack at said first fixed position relative to said rack and said second end of said plurality of linkages being a second linkage end of said plurality of said three linkages which is fastened to said drawer at said second fixed position relative to said drawer, wherein said three linkages are pivotally interconnected for extending between said first and second fixed positions as said drawer is moved between said inward and outward positions relative to said rack.

5. The cabinet of claim 4, wherein one of said three linkages comprises an intermediate linkage which is disposed between two linkages of said three linkages, and said intermediate linkage is substantially shorter than said two linkages.

6. The cabinet of claim 5, wherein said cable fasteners comprise straps mounted to said linkages of said cabled arm, said straps having lengths which are wrapped around monitor and keyboard cabling and said linkages, and then secured to said linkages for securing said monitor and keyboard cabling to said linkages.

7. The cabinet of claim 6, wherein each of said two mounting rails further comprises:

a fastener body having a shank and a head, said shank extending from said head and said head being of a larger size than a portion of said shank adjacent to said head;

said first section having a hole formed there-through for passing said shank of said fastener body transversely through said first section and fitting said head against said first section; and said second section having a slot formed therein, extending in a direction having a component which extends along a respective one of said longitudinal lengths of said two mounting rails, wherein said shank of said fastener body is slidably received within slot.

8. The cabinet of claim 7, further comprising a plurality of rollers, each of said rollers having an inner bearing surface and an outer bearing surface, said inner bearing surface being rotatably mounted to a respective one of said shanks of each of said fastener bodies, and said outer bearing surface fitting within corresponding ones of said slots of said second sections and moveably engaging said respective ones of said shanks and said first sections to said second sections.

9. A cabinet having a rack for mounting at least part of a data processing system, said cabinet comprising:

two mounting rails each having first and second sections which are free to slidably move relative to one another for telescopically adjusting longitudinal lengths of said two mounting rails for fitting the horizontal depth of said rack, and opposite ends of respective ones of said first and second sections having mounting portions for rigidly fastening to said rack to dispose said mounting rails in fixed, stationary positions relative to said rack;

a drawer having a tray and slide rail attachment;

slide assemblies mounted to respective ones of said two mounting rails and to said slide rail attachments of said drawer, for slidably moving said drawer relative to said rack, between an outward position, in which said drawer extends outward of said rack, and an inward position, in which said drawer is substantially disposed within said rack;

a cable arm having a plurality of linkages which arc pivotally connected, said plurality of linkages together having a first end and a second end, wherein said first end is pivotally fastened to said rack at a first fixed position relative to said rack and said second end is pivotally fastened to said drawer at a second fixed position relative to said drawer, wherein said plurality of linkages extend from said first fixed position to second fixed position as said drawer is moved between said inward and outward positions relative to said rack;

cable fasteners for securing monitor and keyboard cabling to said linkages of said cable arm;

an enclosure having two opposite sides, the exterior of which are rigidly secured to said two mounting rails, and said enclosure having a first set of two slide rails which are rigidly mounted to interior sides of respective ones of said two opposite sides; and said two slide assemblies each having first and second bearing tracks, said first bearing tracks facing outward of said slide assemblies for slidably engaging respective ones of said first set of two slide rails mounted said interior sides of said enclosure, and said second bearing tracks facing inward for receiving said slide rail attachments of said drawer, wherein said slide rail attachments comprise a second set of slide rails.

10. A cabinet having a rack for mounting at least part of a data processing system, said cabinet comprising:

two mounting rails each having first and second sections which are free to move in sliding relation to one another for telescopically adjusting longitudinal lengths of said mounting rails for fitting the horizontal depth of said rack, and opposite ends of respective ones of said first and second sections having mounting portions for rigidly fastening to said rack to dispose said mounting rails in fixed, stationary positions relative to said rack;

an enclosure having an exterior which is rigidly secured to said two mounting rails, said enclosure having two slide rails which are rigidly mounted to an interior of said enclosure;

a drawer which is slidably mounted to said two slide rails which are mounted interiorly of said enclosure for moving said drawer between an outward position, in which said drawer extends outward of said enclosure, and an inward position, in which said drawer is substantially disposed within said enclosure;

a keyboard mounted to said drawer for moving with said drawer from said inward position to said outward position; and a monitor which is moveably mounted to said drawer for moving with said drawer from said inward position to said outward position, and then moving said monitor from a downwards position to an upwards position to move said monitor from a stowed position, in which a screen of said monitor extends substantially parallel to a length of said drawer, to a viewing position, in which said monitor screen extends substantially transverse to said length of said drawer.

11. The cabinet of claim 10, wherein each of said two mounting rails further comprises:

a fastener body having a shank and a head, said shank extending outward from said head and said head being of a larger size than a portion of said shank adjacent to said head;

said first section having a hole formed there-through for passing said shank of said fastener body transversely through said first section and fitting said head against said first section; and said second section having a slot formed therein, extending in a direction having a component which extends along a respective one of said longitudinal lengths of said two mounting rails, wherein said shank of said fastener body is slidably received within said slot.

12. The cabinet of claim 11, further comprising a plurality of rollers, each of said rollers having an inner bearing surface and an outer bearing surface, said inner bearing surface being rotatably mounted to a respective one of said shanks of each of said fastener bodies, and said outer surface fitting within corresponding ones of said slots of said second sections to slidably couple respective ones of said shanks and said first sections to said second sections.

13. The cabinet of claim 10, further comprising:

cable arm means having a first end fastened to said rack at a first fixed position relative to said rack and a second end of fastened to said drawer at a second fixed position relative to said drawer, wherein said cable arm means extends from said first fixed position to said second fixed position as said drawer is moved between said inward and outward positions relative to said rack; and cable fastener means for securing monitor and keyboard cabling to said cable arm means.

14. The cabinet of claim 10, further comprising a cable arm having a plurality of at least three linkages which are pivotally connected with one of said plurality of at least three linkages connected on opposite ends thereof to respective ones of two of said plurality of at least three, said plurality of at least three linkages together having a first end fastened to said rack at a first fixed position relative to said rack and a second end of fastened to said drawer at a second fixed position relative to said drawer, wherein said plurality of at least three linkages extend from said first fixed position to said second fixed position and within a single horizontal plane as said drawer is horizontally moved between said inward and outward positions relative to said rack.

15. A cabinet having a rack for mounting at least part of a data processing system, said cabinet comprising:

two mounting rails each having first and second sections which are free to slidably move relative to one another to telescopically adjust longitudinal lengths of said mounting rails for fitting a horizontal depth of said rack, and opposite ends of respective ones of said first and second sections having mounting portions for rigidly fastening to said rack to dispose said mounting rails in fixed, stationary positions relative to said rack;

an enclosure having an exterior which is rigidly secured to said two mounting rails, said enclosure having a first set of two slide rails which are rigidly mounted to an interior of said enclosure;

a second set of side rails;

two bearing slide assemblies, each having a first and second bearing tracks, said first bearing tracks facing outward of said slide assemblies for slidably engaging respective ones of said first set of two slide rails mounted said interior of said enclosure, and said second bearing tracks facing inward for receiving said second set of slide rails; and a drawer having said second set of slide rails exteriorly mounted to said drawer, wherein said second set of slide rails are aligned to slidably engage within said second bearing tracks for slidably coupling said drawer to said enclosure and said rack for moving between an outward position, in which said drawer extends outward of said enclosure, and an inward position, in which said drawer is substantially disposed within said enclosure.

16. The cabinet of claim 15, wherein each of said two mounting rails further comprises:

a fastener body having a shank and a head, said shank extending from said head and said head being of a larger size than a portion of said shank adjacent to said head;

said first section having a hole formed there-through for passing said shank of said fastener body transversely through said first section and fitting said head against said first section; and said second section having a slot formed therein, extending in a direction having a component which extends along a respective one of said longitudinal lengths of said two mounting rails, wherein said shank of said fastener body is slidably received within said slot.

17. The cabinet of claim 16, further comprising a roller having an inner bearing surface which is rotatably mounted to a respective one of said shanks of each of said fastener bodies, and an outer bearing surface which fits within said slot of a respective said second section and moveably engages said respective one of said shanks and said respective said first section to said second section.

18. The cabinet of claim 17, further comprising:

a cable arm having three linkages which are pivotally interconnected one to another, a first end of said linkages being pivotally fastened to said rack at a first fixed position relative to said rack and a second end of said linkages being pivotally fastened to said drawer at a second fixed position relative to said drawer, wherein said three linkages are pivotally interconnected for angularly moving relative to one another in a single horizontal plane to extend between said first and second fixed positions as said drawer is moved between said inward and outward positions relative to said rack, wherein said drawer is moved within said single horizontal plane;

cable fastener straps mounted to said linkages of said cable arm, said cable fastener straps having lengths which are wrapped around monitor and keyboard cabling and said linkages, and then secured to said linkages for securing said monitor and keyboard cabling to said linkages;

a monitor platform having a back plate and a hinge means, said hinge means pivotally mounting one end of said back plate to said drawer for angularly moving between upwards and downwards positions when said drawer is disposed in said outward position;

a clutch which is fixedly mounted between said drawer and said monitor platform, said clutch having gripping means which retains said back plate of said monitor platform in various ones of said upwards and downwards positions in which said back plate is disposed;

a keyboard platform mounted to said drawer;

a keyboard mounted to said keyboard platform for moving with said drawer from said inward position to said outward position, wherein said keyboard is disposed for user access when said drawer is disposed in said outward position; and a monitor mounted to said backplate of said monitor platform for moving with said drawer from said inward position to said outward position, and then angularly moving said backplate from said downwards to said upwards position to move said monitor from a stowed position within said drawer, in which the screen of said monitor extends substantially parallel to the single horizontal plane, to an upright, viewing position, in which the screen of said monitor is disposed transverse to the single horizontal plane.

* * * * *